United States Patent
Wang et al.

(10) Patent No.: US 9,418,191 B2
(45) Date of Patent: Aug. 16, 2016

(54) PROVIDING ELECTRON BEAM PROXIMITY EFFECT CORRECTION BY SIMULATING WRITE OPERATIONS OF POLYGONAL SHAPES

(71) Applicant: Taiwan Semiconductor Manufacturing Company, Ltd., Hsin-Chu (TW)

(72) Inventors: Hung-Chun Wang, Taichung (TW);
Jeng-Horng Chen, Hsin-Chu (TW);
Shy-Jay Lin, Hsinchu County (TW);
Chia-Ping Chiang, Taipei County (TW);
Cheng Kun Tsai, Hsinchu (TW);
Wen-Chun Huang, Tainan (TW);
Ru-Gun Liu, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 331 days.

(21) Appl. No.: 13/886,062

(22) Filed: May 2, 2013

(65) Prior Publication Data
US 2014/0033144 A1     Jan. 30, 2014

Related U.S. Application Data

(63) Continuation of application No. 13/011,165, filed on Jan. 21, 2011, now Pat. No. 8,464,186.

(51) Int. Cl.
| | | |
|---|---|---|
| *G03F 7/00* | (2006.01) |
| *G06F 17/50* | (2006.01) |
| *G03F 1/00* | (2012.01) |
| *G03F 1/78* | (2012.01) |
| *H01J 37/302* | (2006.01) |
| *H01J 37/317* | (2006.01) |
| *B82Y 10/00* | (2011.01) |
| *B82Y 40/00* | (2011.01) |
| *G03F 7/20* | (2006.01) |
| *H01L 21/027* | (2006.01) |

(52) U.S. Cl.
CPC ............ *G06F 17/5081* (2013.01); *B82Y 10/00* (2013.01); *B82Y 40/00* (2013.01); *G03F 1/144* (2013.01); *G03F 1/78* (2013.01); *H01J 37/3026* (2013.01); *H01J 37/3174* (2013.01); *G03F 7/70283* (2013.01); *G03F 7/70441* (2013.01); *H01J 2237/31769* (2013.01); *H01J 2237/31771* (2013.01); *H01L 21/0274* (2013.01); *H01L 21/0275* (2013.01)

(58) Field of Classification Search
None
See application file for complete search history.

(56) References Cited

U.S. PATENT DOCUMENTS

| | | | |
|---|---|---|---|
| 5,393,987 | A | 2/1995 | Abboud et al. |
| 6,658,640 | B2 | 12/2003 | Weed |
| 6,918,104 | B2 | 7/2005 | Pierrat et al. |
| 7,003,757 | B2 | 2/2006 | Pierrat et al. |

(Continued)

*Primary Examiner* — A. M. Thompson
(74) *Attorney, Agent, or Firm* — Haynes and Boone, LLP (57) ABSTRACT

A method for writing a design to a material using an electron beam includes assigning a first dosage to a first polygonal shape. The first polygonal shape occupies a first virtual layer and includes a first set of pixels. The method also includes simulating a first write operation using the first polygonal shape to create the design, discerning an error in the simulated first write operation, and assigning a second dosage to a second polygonal shape to reduce the error. The second polygonal shape occupies a second virtual layer. The method further includes creating a data structure that includes the first and second polygonal shapes and saving the data structure to a non-transitory computer-readable medium.

15 Claims, 5 Drawing Sheets

(56) References Cited

U.S. PATENT DOCUMENTS

| | | |
|---|---|---|
| 7,571,417 B2 | 8/2009 | Izuha et al. |
| 7,698,665 B2 | 4/2010 | Abrams et al. |
| 7,923,703 B2 | 4/2011 | Morokuma et al. |
| 8,078,996 B2 | 12/2011 | Izuha et al. |
| 8,464,186 B2 * | 6/2013 | Wang et al. ............. 716/53 |
| 2002/0187406 A1 * | 12/2002 | Magome et al. ............. 430/5 |
| 2003/0233630 A1 * | 12/2003 | Sandstrom et al. ........... 716/19 |
| 2007/0130558 A1 * | 6/2007 | Ivansen ........................ 716/19 |
| 2009/0135399 A1 * | 5/2009 | Hirukawa et al. ............ 355/71 |
| 2009/0265680 A1 | 10/2009 | Izuha et al. |
| 2009/0307649 A1 | 12/2009 | Pramanik et al. |
| 2011/0226970 A1 | 9/2011 | Krecinic et al. |

* cited by examiner

1110 — assigning a first dosage to a first polygonal shape, the first polygonal shape occupying a first virtual layer and including a first set of pixels 1120 — simulating a first write operation using the first polygonal shape to create the design 1130 — discerning an error in the simulated first write operation 1140 — assigning a second dosage to a second polygonal shape to reduce the error, the second polygonal shape occupying a second virtual layer 1150 — creating a data structure that includes the first and second polygonal shapes 1160 — saving the data structure to a non-transitory computer-readable medium

PROVIDING ELECTRON BEAM PROXIMITY EFFECT CORRECTION BY SIMULATING WRITE OPERATIONS OF POLYGONAL SHAPES

CROSS-REFERENCE

This application is a continuation of U.S. Non-provisional patent application Ser. No. 13/011,165, filed on Jan. 21, 2011, entitled: Systems and Methods Providing Electron Beam Proximity Effect Correction, now U.S. Pat. 8,464,186, which is hereby incorporated by reference in its entirety.

BACKGROUND

The present disclosure relates generally to semiconductor manufacturing. Specifically, the present disclosure relates to systems and methods that provide proximity effect correction for electron beam writing.

Electron-beam (or "e-beam") writing relates to a process for creating changes in a medium using e-beams. Specifically, some e-beam processes use e-beams to write designs onto mediums. Examples of mediums that can be written on with e-beams include semiconductor wafers and photomasks (e.g., fused silica and chrome masks). E-beam writing provides a way to create features on a medium where the features are smaller than a resolution limit for light.

However, as feature sizes shrink, behaviors of e-beams, such as forward scatter and back scatter phenomena, become more significant. As a result of scattering phenomena, a shape actually written to a medium may differ somewhat from the pattern of the pixels written by the e-beam. This is also referred to as the proximity effect. Conventional methods correct for the proximity effect by adding alterations such as serifs or hammerheads to the pixel pattern so that the resulting shape is closer to the desired design feature. Other conventional methods use a pixel-by-pixel dosage modulation process, where dosage of a pixel is equal to beam intensity multiplied by exposure time. The dosage at each pixel can be set to make the resulting shape closer to the desired shape. In an example of a conventional process, a pixel map is provided to a mathematical modeling system that predicts how the resulting shape would appear upon inspection of the medium. The model is then compared to the desired shape to produce an error. The error is minimized by use of shape correction or pixel-by-pixel dosage modulation.

The above-described conventional techniques have some disadvantages. For instance, shape correction by itself may not provide sufficient correction for very fine features. Also, pixel-by-pixel dosage modulation requires much processing power because of the large number of pixels that may be present in a given design. More efficient and effective proximity effect correction is called for.

SUMMARY

The present disclosure provides for many different embodiments. In a first embodiment, a method for writing a design to a material using an electron beam includes assigning a first dosage to a first polygonal shape. The first polygonal shape occupies a first virtual layer and includes a first set of pixels. The method also includes simulating a first write operation using the first polygonal shape to create the design, discerning an error in the simulated first write operation, and assigning a second dosage to a second polygonal shape to reduce the error. The second polygonal shape occupies a second virtual layer. The method further includes creating a data structure that includes the first and second polygonal shapes and saving the data structure to a non-transitory computer-readable medium.

In another embodiment, a computer-based system for facilitating electron beam writing includes a dosage modulation module for proximity effect correction. The dosage modulation module is operable to: create a plurality of polygons, each polygon having a respective dose applied to a respective set of pixels, and further each polygon occupying a respective virtual layer; iteratively apply ones of the layers to correct a simulation writing error; and save the applied ones of the layers to a data structure. The system also includes a non-transitory computer-readable medium storing the data structure.

In another embodiment a program product having a non-transitory computer readable medium tangibly recording computer program logic for performing proximity effect correction includes code to calculate an error for a first shape using a first write simulation operation. The computer program product also has code to apply a first polygon in a first virtual layer to the first shape. The polygon defines a first set of pixels with a first dosage and is generated to address the error. The computer program product also includes code to create a data structure that includes the first shape and the first virtual layer and code to output the data structure in a computer-readable file.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing. Specifically, the present disclosure relates to proximity effect error correction techniques that use polygons to apply dosage modulation. While the examples herein discuss applying the techniques to write to photolithographic masks and semiconductor wafers, it is understood that the scope of embodiments can include any system for writing to any appropriate medium using e-beam technology.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
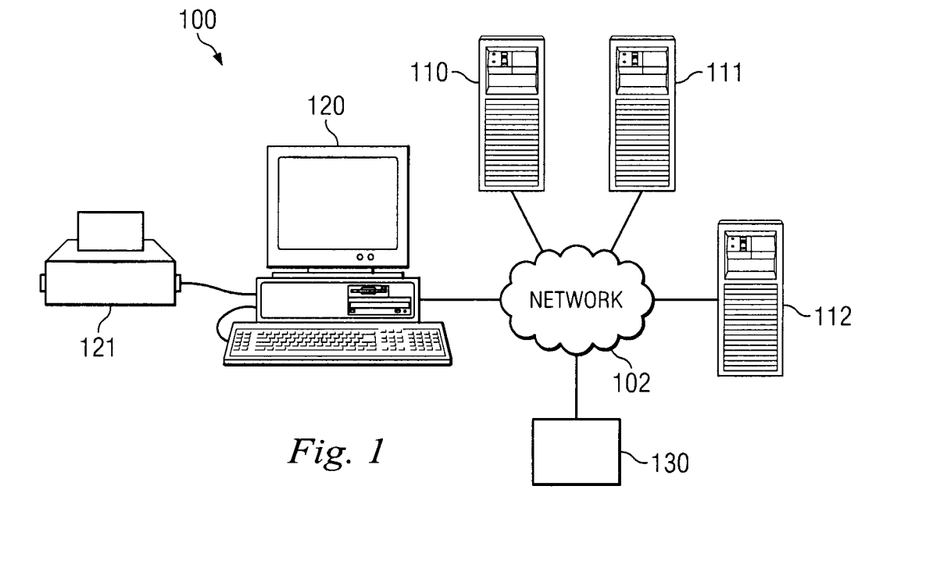
FIG. 1 is a simplified diagram of an exemplary network system in which proximity effect correction embodiments may be implemented.

With reference now to the figures, FIG. 1 is a simplified diagram of a network system 100 in which embodiments may be implemented. Network system 100 includes a network 102 that provides a medium for communications between various devices and computers communicatively coupled by network system 100. Network 102 may be implemented as one or more of various networks, such as the Internet, an intranet, a local area network, a wide area network (WAN), or another network architecture that facilitates communications between network connected devices. Network 102 may include any one or more of various communication connections, such as wire, wireless, fiber optic, satellite links, or other communication media.

In the present example, various servers 110-112 are connected to network 102. In addition, a client 120 is connected to network 102. Servers 110-112 may be implemented as hypertext transfer protocol (HTTP) servers, file transfer protocol (FTP) servers, application servers, or other devices that provide data sources such as web pages or other content to client 120 connected therewith. Client 120 may be implemented as a personal computer, a portable computer, a network computer, a super computer, or another computational device. Client 120 is interconnected with a local printer 121 and/or a network printer for producing hardcopy output.

Additionally, client 100 is connected to e-beam writing hardware 130, which receives files from client 120 and writes to a physical medium according to the data in the file. The data in the files includes layout patterns that are stored and transmitted in a layout description language such as GDS-II or Oasis. Techniques for proximity effect correction discussed further below may be performed by one or more computers, such as client 120 and/or servers 110-112. For instance, one or more computers perform the simulation, error calculation, and polygon generation that is used in the error correction.

Figure 2:
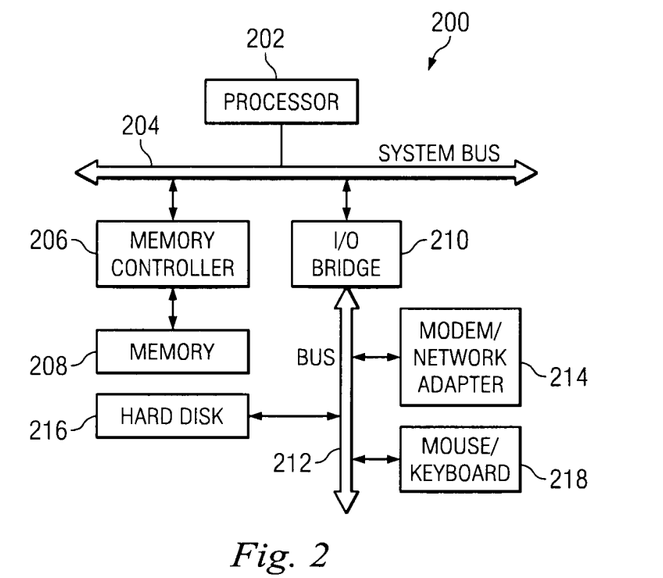
FIG. 2 is a simplified block diagram of an exemplary client computer system that may be configured to implement embodiments of proximity effect correction systems.

FIG. 2 is a simplified block diagram of a computer system 200, such as client 120 or any of servers 110-112 shown in FIG. 1, that may be configured to implement embodiments of a proximity effect correction system. Computer system 200 includes a processor 202 interconnected with a system bus 204. System bus 204 provides couplings to subsystems and components of computer system 200. A memory controller 206 interconnected with a system memory 208 provides a communicative coupling between memory 208 and processor 202. Memory 208 may store executable instructions that provide proximity effect correction functionality as described more fully below. An input/output bridge 210 may be connected with system bus 204, and one or more input/output devices may be connected with an I/O bus 212. For example, a hard disk 216 (or other memory, such as a flash drive) may provide non-transitory, non-volatile storage, and a modem or network adapter 214 may provide a communication interface that facilitates communication exchanges between computer system 200 and one or more data resources on a network. Additionally, user input devices, such as a mouse/keyboard 218, may be coupled with I/O bus 212 and facilitate user input to computer system 200. The configuration of computer system 200 is illustrative and is chosen only to facilitate an understanding of embodiments described herein.

Figure 3:
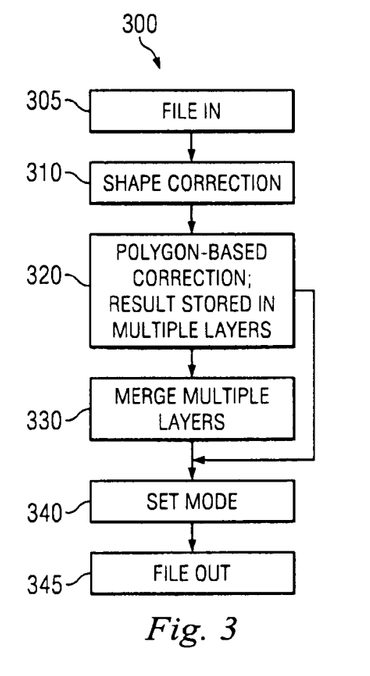
FIGS. 3 and 11 are illustrations of exemplary processes for performing proximity effect correction.
Figure 11:
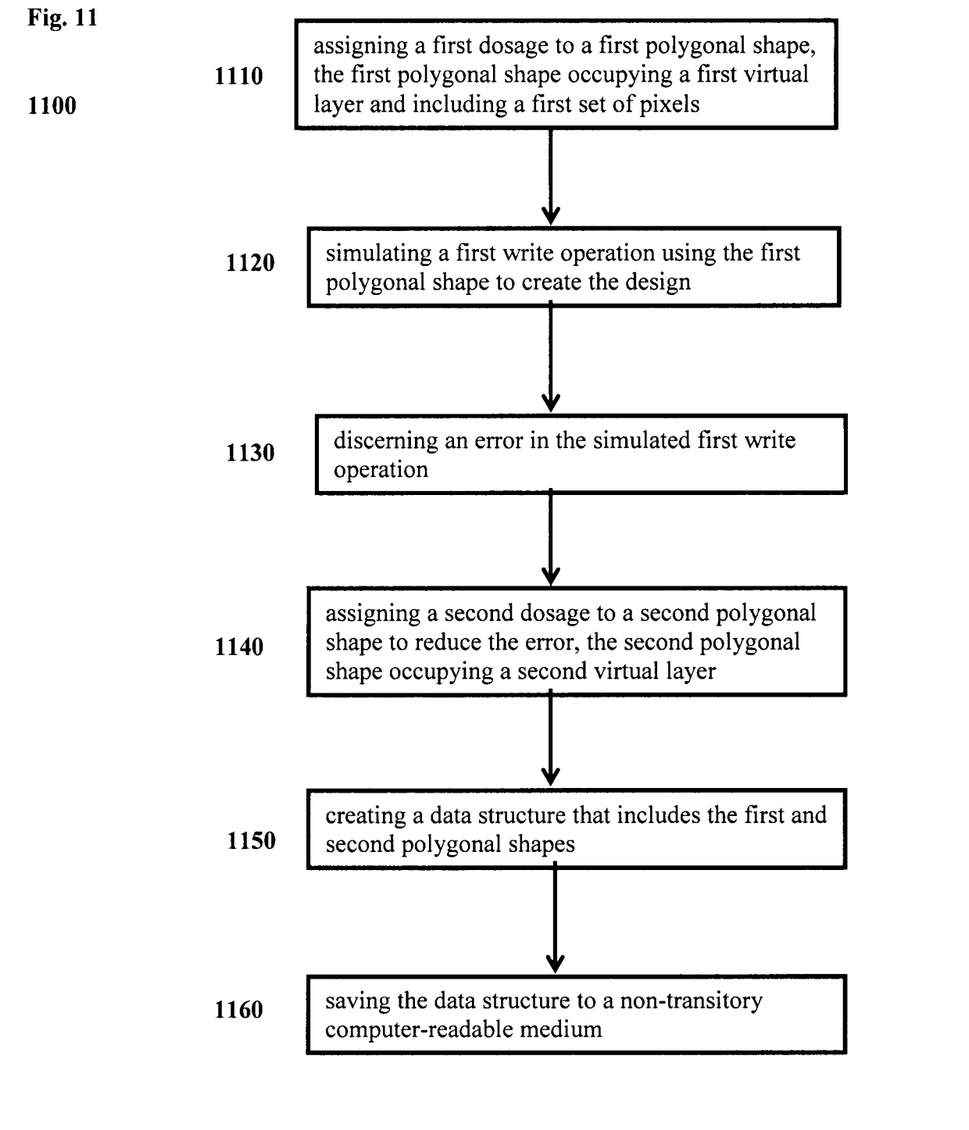

FIG. 3 is an illustration of exemplary process 300 for performing proximity effect correction. Process 300 may be performed, for example, by one or more computers 110-112, 120 of FIG. 1. In block 305, a file is received. In this example, the file includes data for writing a design to a medium. FIG. 11 is also an exemplary process 1100 for performing proximity effect correction.

In block 310, shape correction is performed on the data in the file. In this example, a shape in the file is simulated, and an error is calculated. Changes to the shape are generated to reduce the error, and the shape-corrected file is analyzed at block 320. Shape correction is explained in more detail with respect to FIG. 4.

Figure 4:
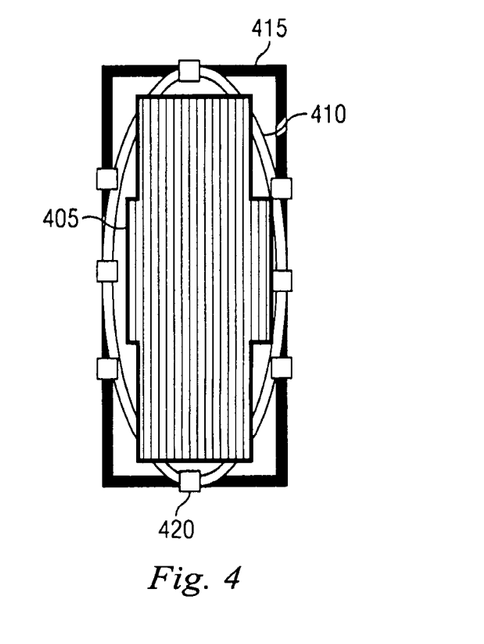
FIG. 4 is an illustration of an exemplary shape correction operation.

Moving to FIG. 4, an illustration of an exemplary shape correction operation is given. Shape 405 is the shape of the pixels that are written. Shape 415 is the target shape for the design. Target shape 415 includes target points 420, which in this example include a multitude of points around the perimeter of target shape 415. Contour 410 is the result of simulation, showing what can be expected when shape 405 is written to a physical medium.

After simulation, a cost function is run to discern an error between contour 410 and target shape 415. The cost function can be any function able to identify an error between contour 410 and target shape 415. Further, the cost function may be a function of any one or more of the following parameters: Edge Placement Error (EPE, the distance between an edge of a contour and a given target point), Process Window (PW), Normalized Image Slope (NILS), Wafer Error Enhancement Factor (WEEF), Image Log Slope (ILS), Depth of Focus (DoF), Exposure Latitude (EL). One example of a cost function is given by Equation (1) below. It is understood that the scope of embodiments includes any other cost functions capable of identifying an error.

$$\text{Error} = \sum_{targetpoint\ 1}^{targetpoint\ n} EPE^2 \qquad \text{Eq. (1)}$$

Of note in FIG. 4 is the number of target points 415. FIG. 4 shows eight target points 415, though other embodiments may have more or fewer. Generally, when more target points are used, the shape correction process requires more time and more processing power but may provide more precise results. Such considerations can be matched to the particular application of a given embodiment, and in some applications the number of target points can be defined by a user.

If the size of the error as given by the cost function is within an acceptable range, then the proximity effect correction may skip to block 345 (FIG. 3). On the other hand, if the size of the error is not within an acceptable range, then shape correction is performed on shape 405. Examples of shape correction include adding serifs, hammerheads, and other shape modifications to shape 405 to reduce the error. In FIG. 4, contour 410 matches target points 420 closely, so error in the particular case of FIG. 4 is expected to be low, though it may or may not be low enough to be within an acceptable range. In some embodiments, acceptable error ranges can be set by a user.

The embodiment of FIG. 3 uses shape correction as a preliminary or coarse correction function and uses polygon-based correction as a finer correction operation. In other embodiments, shape correction is omitted, such that the first correction applied to the file is polygon-based correction. Different applications may include or omit the shape correction of block 310 depending on various factors, such as time constraints and available processing power.

Returning to FIG. 3, in block 320, the shape-corrected file is simulated again to calculate an error. The error can be calculated using the same or a different cost function from the shape correction example above. If the calculated error is within an acceptable range, then process 300 may omit polygon-based correction. However, if the calculated error is not within the acceptable range, then polygon-based correction is performed to reduce the error. Polygon-based correction is explained in more detail below with respect to FIGS. 5-10.

Figure 5:
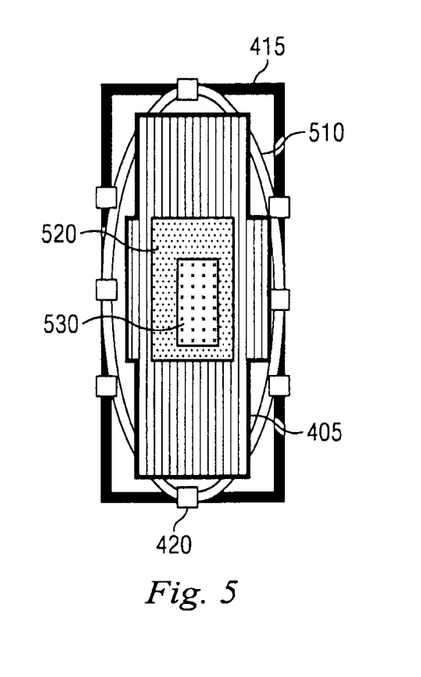
FIG. 5 is an illustration of an exemplary polygon-based correction operation.

Moving to FIG. 5, an example of polygon-based correction is shown. Target shape 415 and target points 420 are the same as in FIG. 4. Shape 405 is overlaid with polygons 520, 530 to create contour 510 during simulation, which has an incrementally smaller error than does contour 410 of FIG. 4.

Polygons 520 and 530 each define a set of pixels that have a dosage associated therewith. Moreover, each of polygons 520, 530 is associated with a virtual layer. For example, the layer that includes polygon 520 overlays shape 405, and the layer that includes polygon 530 overlays shape 405 as well as the layer that includes polygon 520. The layers are virtual in that they do not represent physical layers, but rather, provide a way to conceptually separate and/or stack different polygons.

Also, each one of polygons 520, 530 can be additive or subtractive. In one example, polygon 520 is additive so that the pixels therein have a dosage of +3 shots (where shots is a unit of dosage, explained further below). The dosage +3 adds to the pixels of the shape 405 that are directly below polygon 520. In the same example, polygon 530 is subtractive so that the pixels therein have a dosage of −1. The dosage −1 subtracts one shot from each of the pixels of shape 405 and polygon 520 that lie directly below polygon 530. Such concept is described further with respect to FIG. 8.

Figure 6:
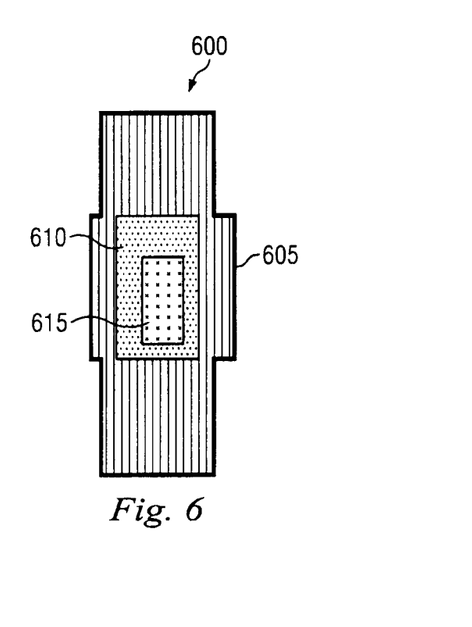
FIG. 6 shows an exemplary dosage/shot number map, which corresponds to the scenario of FIG. 5.

FIG. 6 shows exemplary dosage/shot number map 600, which corresponds to the scenario of FIG. 5. The set of pixels in area 605 has a uniform dosage. Similarly, the pixels in area 610 have a different uniform dosage that includes the dosage of shape 405 modified by the dosage associated with polygon 610. The pixels in area 615 have a third uniform dosage that is cumulative of the dosages of polygons 520, 530 and shape 405.

Polygon-based correction is iterative in this example. For instance, when a shape with an error is submitted for polygon-based correction, the system generates a layer with a polygon that has a shape, position, and dosage that is calculated to reduce the error. In the example of FIG. 5, the system generates a layer that has polygon 520. The system then runs a simulation and calculates an error again. The system determines that the new error is still not in an acceptable range and generates a layer with polygon 530 to further reduce the error. The system runs another simulation and error analysis and can end polygon-based correction or can perform further iterations by generating more polygons in more layers. Various embodiments can perform any number of iterations to reach a desired error range.

Figure 7:
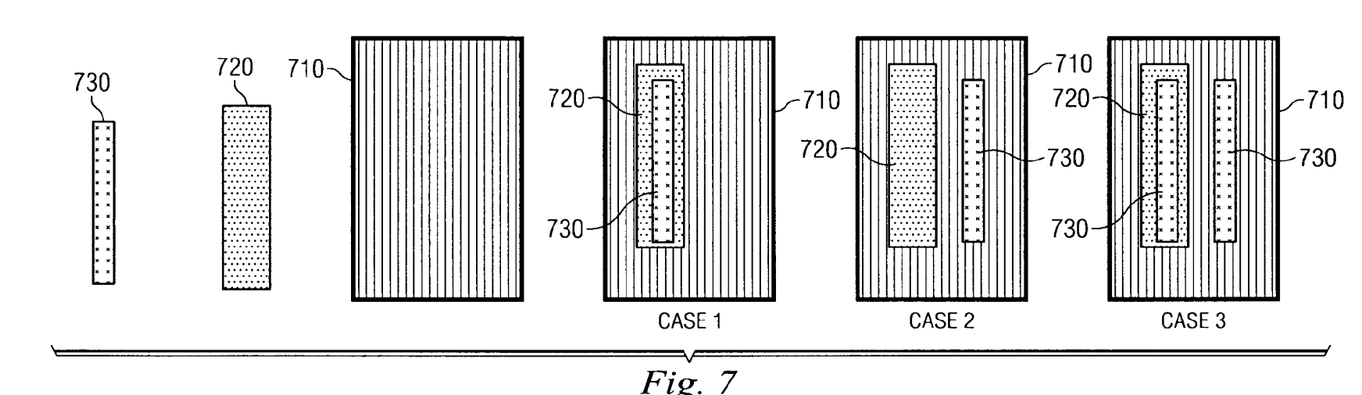
FIG. 7 illustrates exemplary polygons, where in each layer there is a freedom of shape, position, and number of polygons.

In each layer, there is a freedom of shape, position, and number of polygons. This principle is illustrated by FIG. 7, which shows polygons 710, 720, 730. In case 1, there are three layers—one that includes polygon 710, one that includes polygon 720, and one that includes polygon 730. In case 2, there may be three layers, as in case 1, but with a different spatial arrangement of polygon 730 in one of the layers. Alternatively, there could be two layers—one for polygon 710 and one that has polygons 720 and 730. Case 3 shows that any of polygons 710, 720, 730 may be included in more than one layer and/or may be repeated in any single layer.

Figure 8:
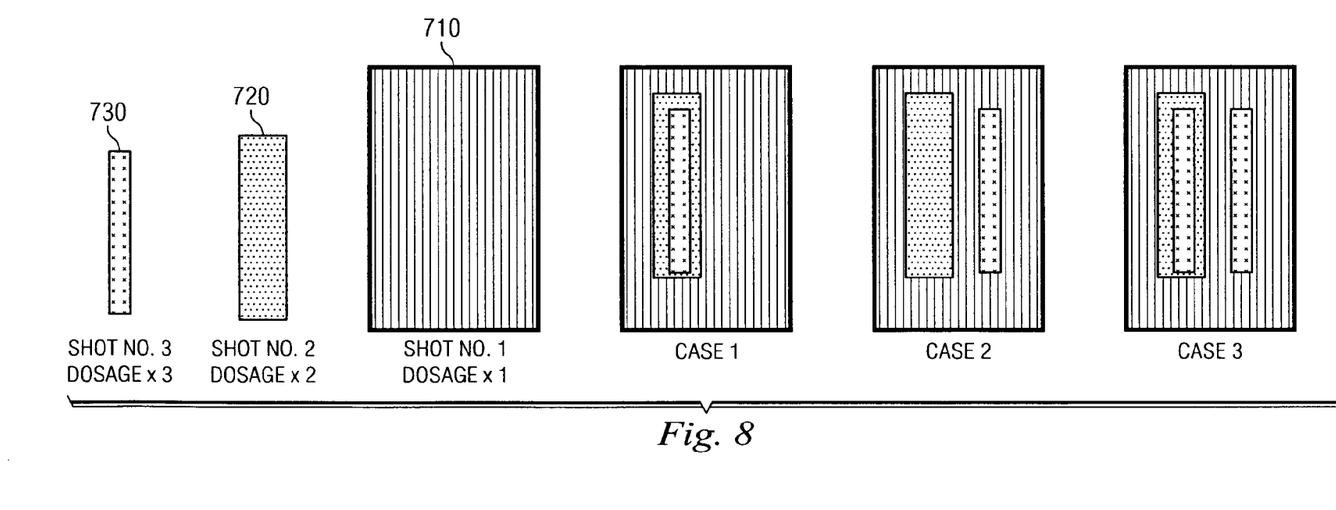
FIG. 8 illustrates freedom of dosage in the context of the polygons of FIG. 7.

Furthermore, in each layer, there is freedom of dosage. FIG. 8 illustrates freedom of dosage in the context of three polygons 710, 720, 730. In this example, polygon 710 is assigned one shot, where one shot can be an arbitrarily defined unit of dosage for the pixels in a polygon. For instance, a shot can indicate a specific beam intensity applied for a specific time. Shot equivalents can be produced by modulating the intensity of a beam and/or the speed of writing at a particular intensity.

Further in this example, polygon 720 is assigned a two-shot dose, and polygon 730 is assigned a three-shot dose. Any arbitrary dosage can be assigned to a given polygon. Although not illustrated in FIG. 8, dosage sign is an aspect of dosage freedom. For instance, polygons 710, 720, 730 are shown as having positive dosages, though any one or all three could have a negative dosage. A negative dosage indicates that, for the multi-layered shape as a whole, some pixels may have dosage subtracted by one or more layers. Polygons 710, 720, 730 are arranged to give particular sets of pixels desired dosages, and some layers may include both negative- and positive-signed polygons.

Referring back to FIG. 3, block 320 includes iteratively applying layers with one or more polygons until the cost function shows that an error is within an acceptable range. As explained above, for each of the layers, there is freedom of number of polygons, shape of polygons, position of polygons, and dosage of polygons. The layers, polygons, shapes, positions, and dosages to be applied in block 320 can be determined in any of a number of ways. In one example, shape correction is determined by a human user using knowledge or skill to apply an appropriate number of layers and polygons and to position, shape, and apply dosage to the polygons. In another example, a computer program uses models and/or rules to determine the specific details of the correction. The scope of embodiments is not limited to any particular method for deciding the number of layers and polygons and the positions, shapes, and dosages of the polygons.

Once the system discerns that the error is within an acceptable range, the system prepares to select a mode at block 340. Process 300 provides for two modes. The first mode is a merged mode, as shown at block 330. In the merged mode, the multiple layers and the shape are added to give a map of pixels with cumulative dosage values. After block 330, the file is effectively a single-layer pixel map where the dosages of the pixels have been summed from the different virtual layers.

The second mode is a layer-by-layer mode. Each of the virtual layers are kept separate so that they are not added before the file is output. A mode can be selected at block 340 by a human user or by computer logic, depending on the application.

The file is output at block 345. The file can be saved to a non-transitory medium, such as a hard drive, optical disc, flash drive, or the like. The file can be loaded to an e-beam writing machine over a network or by physical media. In any event, the e-beam writing machine (e.g., machine 130 of FIG. 1) uses the data and instructions in the file to write the specified design to a medium.

Figure 9:
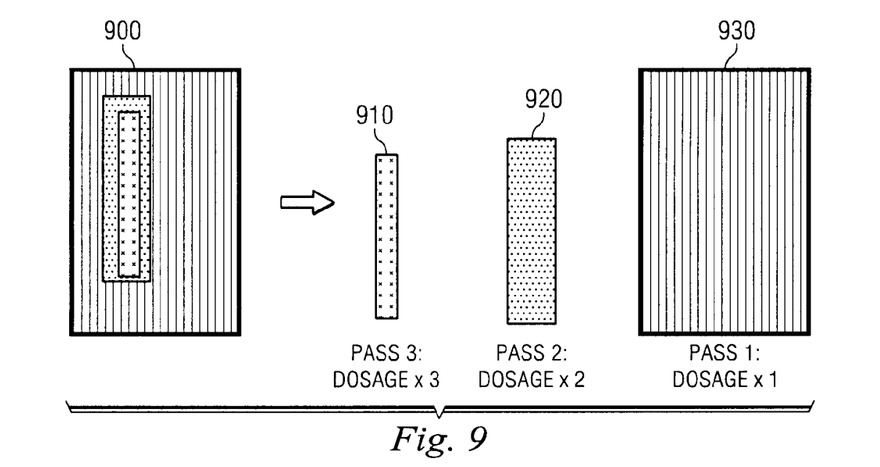
FIG. 9 is an illustration of an exemplary layer-by-layer writing process.

If the merged mode was selected at block 340, the e-beam writing machine may perform a single pass, modulating dosage of the individual pixels during the pass. On the other hand, if the layer-by-layer mode was selected at block 340, then the e-beam writing machine may make as many passes as there are layers. FIG. 9 is an illustration of an exemplary layer-by-layer writing process. Pattern 900 is written in a three-step process. In pass one, a first dosage is applied according to polygon 930 in a first layer. In pass two, a second dosage is applied according to second polygon 920 in a second layer. The pixels that are within polygon 920 thereby receive a cumulative dose defined by the first two layers. In pass three, a third dosage is applied according to polygon 910 in a third layer. The pixels that are within polygon 910 receive a cumulative dose defined by the three layers.

Figure 10:
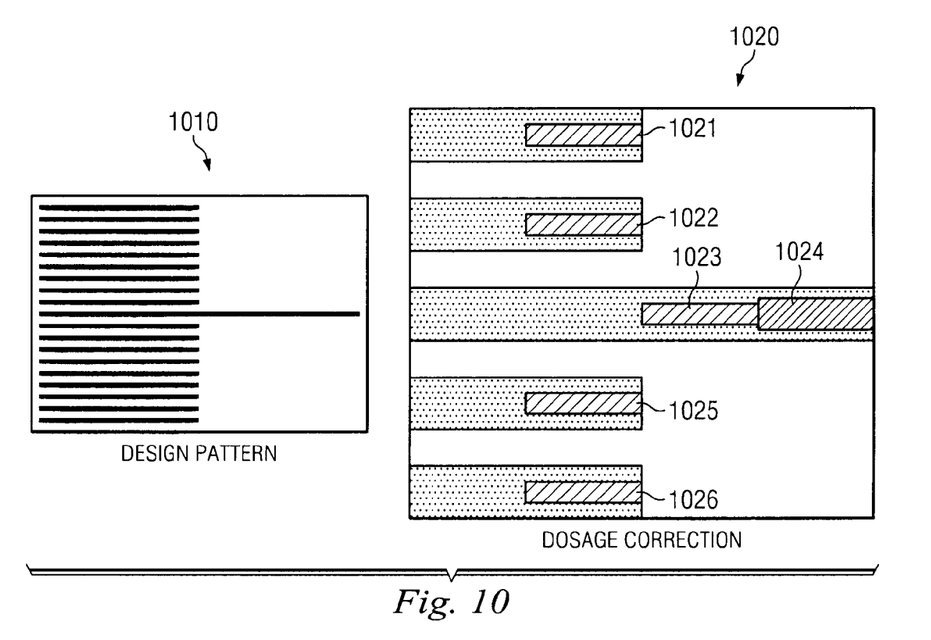
FIG. 10 is an illustration of an exemplary design pattern and a close-up of an exemplary dosage correction applied to part of the design pattern by one or more processes and systems described herein.

FIG. 10 is an illustration of an exemplary design pattern 1010 and a close-up of an exemplary dosage correction 1020 applied to part of the design pattern by the processes and systems described herein. The dosage correction includes an underlying shape that is modified by polygons 1021-1026. The different shading represents different dosages. Polygons 1021-1026 can be applied using one or more virtual layers and can be merged or written layer-by-layer, as described above.

The e-beam writing process includes writing to a physical medium. In one example, the e-beam writing process is used to etch material from a semiconductor wafer in a design that facilitates the manufacture of structures on the wafer. In another example, the e-beam writing process is used to remove portions of a photomask that is made of, e.g., chrome and fused silica. The photomask can then be used in the manufacturing process of semiconductor devices. E-beam writing processes provide an effective way to create designs on a physical medium where some of the features of the design may be too small to be made by other conventional processes, such as photolithography.

FIG. 11 shows process 1100, which includes action 1110, assigning a first dosage to a first polygonal shape, the first polygonal shape occupying a first virtual layer and including a first set of pixels. Action 1120 includes simulating a first write operation using the first polygonal shape to create the design. Action 1130 includes discerning an error in the simulated first write operation. Action 1140 includes assigning a second dosage to a second polygonal shape to reduce the error, the second polygonal shape occupying a second virtual layer. Action 1150 includes creating a data structure that includes the first and second polygonal shapes. Action 1160 includes saving the data structure to a non-transitory computer-readable medium. Various embodiments may include advantages over other techniques. For instance, as explained above, pixel-by-pixel dosage modulation may use more processing power than is desirable because designs that vary dosage pixel-by-pixel can be quite complex. By contrast, some embodiments using a polygon-based technique for dosage modulation may experience increased efficiency because regimes employing large multi-pixel polygons may be less complex that regimes that employ pixel-by-pixel techniques. Additionally, currently-available tools to write e-beam designs can readily adopt the polygon-based processes described above with software and/or firmware changes, thereby allowing various embodiments to be implemented quickly and cost-effectively.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A non-transitory computer readable medium tangibly recording executable instructions for performing proximity effect correction, the non-transitory computer readable medium comprising:
    code to create a plurality of virtual layers including first and second virtual layers, the first virtual layer including a first polygon having a first dose applied to a first set of pixels, the second virtual layer including a second polygon having a second dose applied to a second set of pixels;
    code to iteratively apply the first and second virtual layers to correct a simulation writing error;
    code to save the first and second virtual layers to a data structure, after iteratively applying the first and second virtual layers to correct a simulation writing error; and
    code to output the data structure in a computer readable file; and
    code to control an electron beam emitter to write a design from data in the data file onto a physical material.

2. The non-transitory computer readable medium of claim 1, further comprising:
    code to receive input from a user to select a mode for the data structure, the mode including at least one of a first mode in which respective virtual layers are conceptually separate and a second mode in which respective virtual layers are merged.

3. The non-transitory computer readable medium of claim 1, in which the code to iteratively apply the first and second virtual layers comprises:
    code to perform a simulated first write operation of the first polygon;
    code to calculate a first error in the simulated first write operation;
    code to perform a simulated second write operation of the second polygon; and
    code to calculate a second error in the simulated second write operation,
    wherein, based on the first error, the second dose is applied to the second set of pixels of the second polygon.

4. The non-transitory computer readable medium of claim 3, in which the code to calculate the first error comprises:
    code to generate a contour from the simulated first write operation; and
    code to compare the contour to a set of target points representing a desired shape.

5. The non-transitory computer readable medium of claim 4, further comprising:
    code to apply a cost function to calculate the first error based on results from the code to compare the contour.

6. A method for writing a design to a material using an electron beam, the method comprising:
    simulating a first write operation on a candidate shape;
    discerning an initial error from the first simulated write operation;
    iteratively reducing the initial error through a first simulated write operation and a second subsequent simulated write operation, the first and second subsequent simulated write operations including applying first and second polygons, respectively, to the candidate shape, the first and second polygons having first and second doses applied to first and second set of pixels, respectively, and further the first and second polygons occupying first and second virtual layers, respectively;

creating a data structure that includes the candidate shape and first and second polygons from the first and second subsequent simulated write operations; and saving the data structure to a non-transitory computer-readable medium.

7. The method of claim 6, in which the first and second subsequent simulated write operations comprise:

assigning the first dosage to the first polygon;

performing the first simulated write operation of the first polygon;

discerning a first error in the first simulated second write operation;

assigning the second dosage to the second polygon to reduce the first error.

performing the second subsequent simulated write operation of the second polygon; and discerning a second error in the second subsequent simulated second write operation.

8. The method of claim 6, in which creating the data structure comprises:

merging the first virtual layer and the second virtual layer by adding the first dosage and the second dosage in an overlap area of the first polygon and the second polygon.

9. The method of claim 6, further comprising:

writing the design to the material by loading the saved data structure to an electron beam writing machine.

10. The method of claim 9, in which the material is selected from the list consisting of:

a semiconductor wafer; and a photomask.

11. The method of claim 9, in which writing the design comprises:

reading the data structure from the non-transitory computer-readable medium; and applying dosages corresponding to polygons in the subsequent simulated write operations with an electron beam to the material, according to data in the data structure.

12. The method of claim 11, in which applying dosages includes at least one of:

modulating an intensity of an the electron beam; and modulating a speed of writing with the electron beam.

13. The method of claim 6, further comprising performing a shape correction operation on the candidate shape in response to the initial error, before iteratively reducing the initial error.

14. The method of claim 6, in which the first and second virtual layers include:

freedom as to number of polygons;

freedom as to dosage;

freedom as to shape of polygons; and freedom as to positions of polygons.

15. The method of claim 6, in which the second dose for the second polygon is negative.

* * * * *